United States Patent
Jhang et al.

(10) Patent No.: US 9,337,208 B2
(45) Date of Patent: May 10, 2016

(54) SEMICONDUCTOR MEMORY ARRAY WITH AIR GAPS BETWEEN ADJACENT GATE STRUCTURES AND METHOD OF MANUFACTURING THE SAME

(71) Applicant: MACRONIX International Co., Ltd., Hsinchu (TW)

(72) Inventors: Pei-Ci Jhang, Hsinchu (TW); Chun-Min Cheng, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/495,385

(22) Filed: Sep. 24, 2014

(65) Prior Publication Data

US 2016/0086966 A1    Mar. 24, 2016

(51) Int. Cl.
    *H01L 27/115*       (2006.01)
    *H01L 21/28*        (2006.01)
    *H01L 29/423*       (2006.01)

(52) U.S. Cl.
    CPC .... *H01L 27/11568* (2013.01); *H01L 21/28282* (2013.01); *H01L 29/42356* (2013.01)

(58) Field of Classification Search
    CPC .................................................. H01L 21/764
    See application file for complete search history.

(56) References Cited

U.S. PATENT DOCUMENTS

| | | | | |
|---|---|---|---|---|
| 6,208,030 | B1 * | 3/2001 | Tsui et al. | 257/758 |
| 7,682,904 | B2 * | 3/2010 | Kim | H01L 21/764 |
| | | | | 257/E21.209 |
| 8,436,410 | B2 * | 5/2013 | Kang | H01L 21/764 |
| | | | | 257/315 |
| 8,765,572 | B2 * | 7/2014 | Choi | H01L 21/7682 |
| | | | | 257/315 |
| 8,937,367 | B2 * | 1/2015 | Kim | H01L 29/0649 |
| | | | | 257/522 |
| 2008/0293197 | A1 * | 11/2008 | Ko | 438/257 |
| 2009/0206391 | A1 * | 8/2009 | Ando et al. | 257/324 |
| 2011/0318914 | A1 * | 12/2011 | Choi et al. | 438/587 |
| 2012/0156855 | A1 * | 6/2012 | Sim | 438/421 |
| 2013/0256761 | A1 * | 10/2013 | Sim | 257/208 |

* cited by examiner

*Primary Examiner* — Lex Malsawma
(74) *Attorney, Agent, or Firm* — J.C. Patents

(57) ABSTRACT

A method of manufacturing a semiconductor device is provided. Gate structures are formed on a substrate, and a first dielectric layer having grooves is formed between two adjacent gate structures. An upper surface of the first dielectric layer is lower than an upper surface of the gate structures. Afterwards, an intermediate layer is formed to cover the gate structures, the first dielectric layer, and the grooves, and openings are formed therein. Each opening is formed between two adjacent gate structures, and the first dielectric layer is removed through the opening. Next, a second dielectric layer is formed on the intermediate layer, so as to define an air gap between two adjacent gate structures. Furthermore, a semiconductor device is provided.

5 Claims, 6 Drawing Sheets

SEMICONDUCTOR MEMORY ARRAY WITH AIR GAPS BETWEEN ADJACENT GATE STRUCTURES AND METHOD OF MANUFACTURING THE SAME

BACKGROUND OF THE INVENTION

1. Field of the Invention

The invention relates to a semiconductor device and a method of manufacturing the same.

2. Description of Related Art

In the current trend of improving semiconductor device integration, the size of semiconductor device is reduced according to the design rules. As the size decreases, however, the resistor-capacitor delay (RC delay) and electrical interference between the components impose more limitation on the speed of the integrated circuit and affect the reliability and stability. Therefore, how to improve the low working efficiency of the semiconductor device, caused by the resistor-capacitor delay (RC delay), is an important issue that needs to be overcome.

SUMMARY OF THE INVENTION

The invention provides a method of manufacturing a semiconductor device, wherein an air gap is formed between gate structures to effectively prevent resistor-capacitor delay (RC delay) between the gate structures and improve electrical interference between the components, thereby enhancing efficiency of the semiconductor device.

The method of the semiconductor device provided by the invention includes the following. A plurality of gate structures are formed on a substrate, and a first dielectric layer is formed between two adjacent gate structures. An upper surface of the first dielectric layer is lower than an upper surface of the gate structures, and the first dielectric layer has a first groove. Then, an intermediate layer is formed to cover the gate structures, the first dielectric layer, and the first groove. A plurality of openings are formed in the intermediate layer, and each of the openings is located between two adjacent gate structures. The first dielectric layer between the two adjacent gate structures is removed through the opening. Thereafter, a second dielectric layer is formed on the intermediate layer, so as to define an air gap between the two adjacent gate structures.

According to an embodiment of the invention, in the manufacturing method, the intermediate layer on each of the first grooves has a second groove. Here, a method of forming the openings in the intermediate layer includes forming a spacer on a sidewall of each second groove to expose the intermediate layer. A portion of the intermediate layer is removed to form the openings with the spacer as a mask, and then the spacer is removed.

According to an embodiment of the invention, in the manufacturing method, a method of forming the intermediate layer includes forming a first intermediate material layer on the gate structures and the first dielectric layer, and forming a second intermediate material layer on the first intermediate material layer.

According to an embodiment of the invention, in the manufacturing method, a material of the second intermediate material layer is different from a material of the first intermediate material layer and different from a material of the spacer.

According to an embodiment of the invention, in the manufacturing method, the material of the second intermediate material layer includes silicon nitride, and the material of the first intermediate material layer and the material of the spacer include silicon oxide.

According to an embodiment of the invention, the manufacturing method further includes removing a portion of the first intermediate material layer on the first dielectric layer when removing the first dielectric layer between two adjacent gate structures through the openings.

According to an embodiment of the invention, the manufacturing method further includes forming a metal silicide layer on a gate conductor layer of each of the gate structures by performing a metal silicification process before forming the first intermediate material layer, wherein a height of the air gap is higher than an upper surface of the gate conductor layer.

According to an embodiment of the invention, in the manufacturing method, each of the gate structures includes a hard mask layer located on the corresponding gate conductor layer, and a method of forming the first dielectric layer includes forming a dielectric material layer on the substrate to cover the hard mask layer of each of the gate structures, wherein the dielectric material layer between two adjacent gate structures has a void. Anisotropic etching is performed on the dielectric material layer. A stop layer and a third dielectric layer are formed in sequence on the etched dielectric material layer. A planarization process is performed on the third dielectric layer until the stop layer is exposed. The stop layer is removed, and the hard mask layer is removed. Then, the first dielectric layer is formed by performing etchback on the dielectric material layer.

According to an embodiment of the invention, in the manufacturing method, a height of the void is greater than a height of the surface of the gate conductor layer.

According to an embodiment of the invention, in the manufacturing method, the planarization process includes chemical mechanical polishing.

According to an embodiment of the invention, in the manufacturing method, a method of removing the first dielectric layer between two adjacent gate structures through the opening includes wet etching.

The invention further provides a semiconductor device that includes a plurality of gate structures disposed on a substrate, an intermediate layer disposed on the gate structures and above the substrate between two adjacent gate structures, and a dielectric layer disposed on the intermediate layer. An air gap is formed between two adjacent gate structures.

According to an embodiment of the invention, in the semiconductor device, each air gap includes a main space defined by sidewalls of two adjacent gate structures, a surface of the substrate, and the intermediate layer; and a protruding space located on the main space and defined by the intermediate layer and the dielectric layer.

According to an embodiment of the invention, in the semiconductor device, the intermediate layer includes a first intermediate material layer disposed on a surface and the sidewall of the gate structure, and a second intermediate material layer disposed on the first intermediate material layer and having an opening between two adjacent gate structures.

According to an embodiment of the invention, in the semiconductor device, a material of the second intermediate material layer is different from a material of the first intermediate material layer.

According to an embodiment of the invention, in the semiconductor device, the material of the second intermediate material layer includes silicon nitride, and the material of the first intermediate material layer includes silicon oxide.

According to an embodiment of the invention, in the semiconductor device, each of the gate structures includes a gate conductor layer and a metal silicide layer, and a height of the main space is greater than a height of a surface of the gate conductor layer.

According to an embodiment of the invention, the semiconductor device includes a memory device, and each of the gate structures includes a charge storage layer disposed between the corresponding gate conductor layer and the substrate.

According to an embodiment of the invention, in the semiconductor device, a volume of each air gap is 5% to 95% of a gap between two adjacent gate structures.

Based on the above, the manufacturing method of the semiconductor device, provided by the invention, is adapted for forming the air gap between two adjacent gate structures, and the height of the air gap is higher than the upper surface of the gate conductor layer of the gate structure. Therefore, the resistor-capacitor delay (RC delay) between the gate structures is effectively prevented to improve electrical interference between the components, thereby enhancing efficiency of the semiconductor device.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1J are schematic cross-sectional views illustrating a manufacturing process of a semiconductor device according to an embodiment of the invention.

Figure 1A:
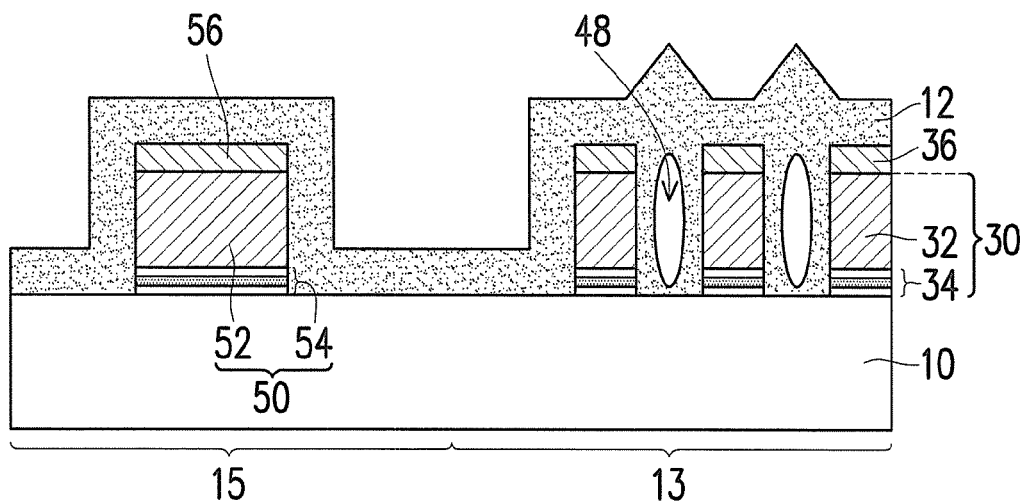
FIG. 1A to FIG. 1K are schematic cross-sectional views illustrating a manufacturing process of a semiconductor device according to an embodiment of the invention.

With reference to FIG. 1A, a substrate 10 is provided. The substrate 10 is a semiconductor substrate, a semiconductor compound substrate, or a semiconductor over insulator (SOI) substrate, for example. The semiconductor is IVA group atoms, such as silicon or germanium, for example. The semiconductor compound is formed of IVA group atoms, such as silicon carbide or silicon germanium, or formed of IIIA group atoms and VA group atoms, such as gallium arsenide, for example. The substrate 10 includes a first region 13 and a second region 15. In an embodiment, the first region 13 is a memory cell region and the second region 15 is a peripheral circuit region, for example.

With reference to FIG. 1A, then, a plurality of gate structures 30 and 50 are formed on the substrate 10. The gate structures 30 and 50 at least include gate conductor layers 32 and 52. A material of the gate conductor layer 32 may be a conductor, such as doped polysilicon. Moreover, as shown in FIG. 1A, the gate structures 30 and 50 further include dielectric layers 34 and 54 respectively, which are located between the corresponding gate conductor layers 32 and 52 and the substrate 10. In an embodiment, the semiconductor device is a memory device, and the dielectric layers 34 and 54 are charge storage layers, for example. The charge storage layer may be a stack structure, such as an oxide-nitride-oxide (ONO) layer, which includes three layers, i.e. silicon oxide/silicon nitride/silicon oxide. In addition, as shown in FIG. 1A, the gate structures 30 and 50 further include hard mask layers 36 and 56 respectively, which are located on the corresponding gate conductor layers 32 and 52. A material of the hard mask layers 36 and 56 may be silicon oxide, silicon oxynitride, or silicon nitride, for example.

With reference to FIG. 1A again, next, a dielectric material layer 12 is formed on the substrate 10 to cover the hard mask layers 36 and 56 on the gate structures 30 and 50. The dielectric material layer 12 between two adjacent gate structures 30 in the first region 13 has a void 48. In an embodiment, a height of the void 48 is greater than a height of a surface of the gate conductor layer 32. A material of the dielectric material layer 12 is silicon oxide, phosphosilicate glass, borophosphosilicate glass, or a combination thereof, for example. A method of forming the dielectric material layer 12 includes high-density plasma chemical vapor deposition (HDP-CVD), for example.

Figure 1B:
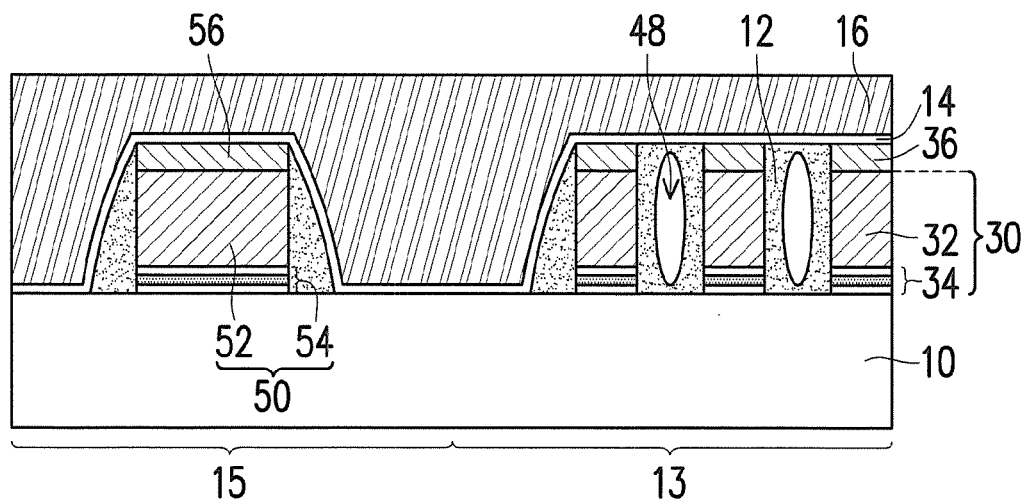

With reference to FIG. 1A and FIG. 1B, thereafter, a portion of the dielectric material layer 12 is removed by performing an anisotropic etching process on the dielectric material layer 12 to expose a top of the hard mask layers 30 and 56. Afterwards, a stop layer 14 and a dielectric layer 16 are formed in sequence on the etched dielectric material layer 12. A material of the stop layer 14 is different from the material of the dielectric material layer 12 and different from a material of the dielectric layer 16. The material of the stop layer 14 is silicon nitride, silicon oxynitride, silicon carbon oxynitride, or silicon carbide, for example. A method of forming the stop layer 14 includes chemical vapor deposition or atomic layer deposition (ALD), for example. The material of the dielectric layer 16 is silicon oxide, and a method of forming the dielectric layer 16 includes HDP-CVD, for example.

Figure 1C:
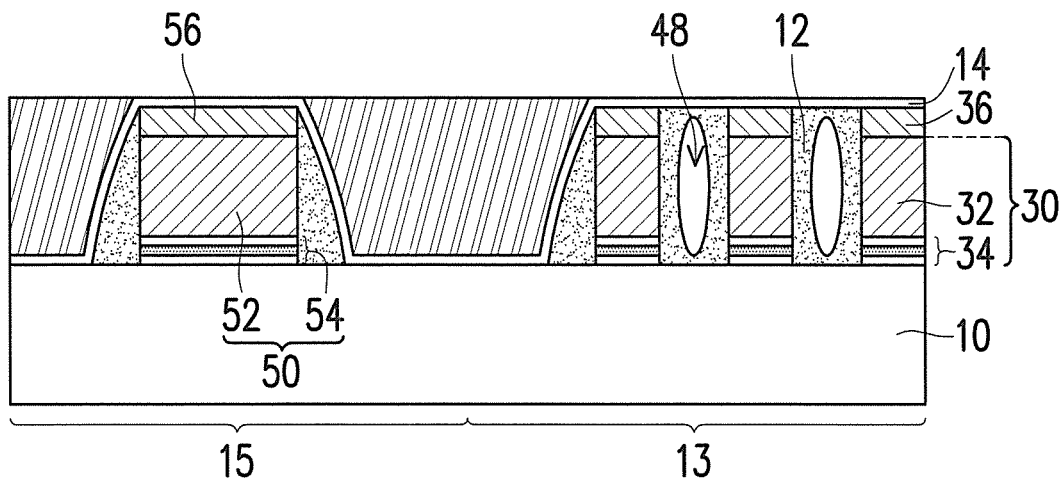
Figure 1D:
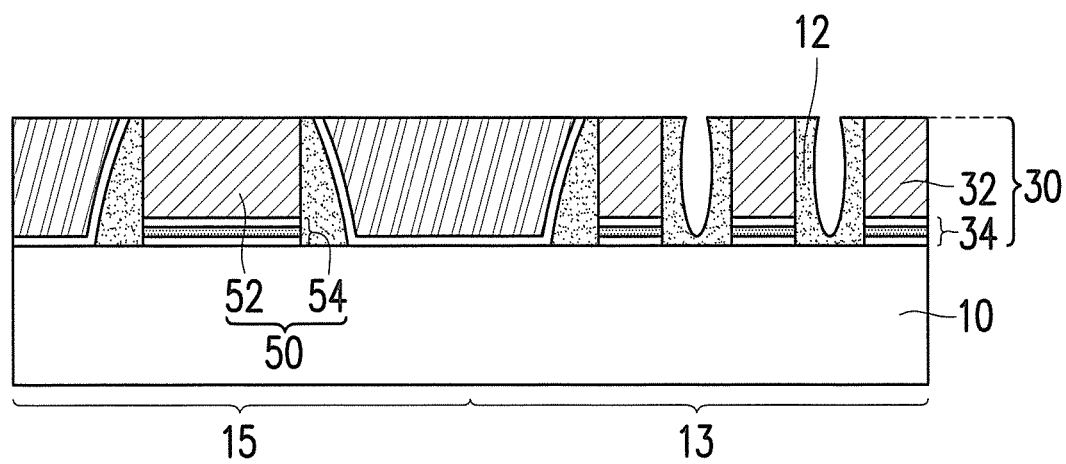
Figure 1E:
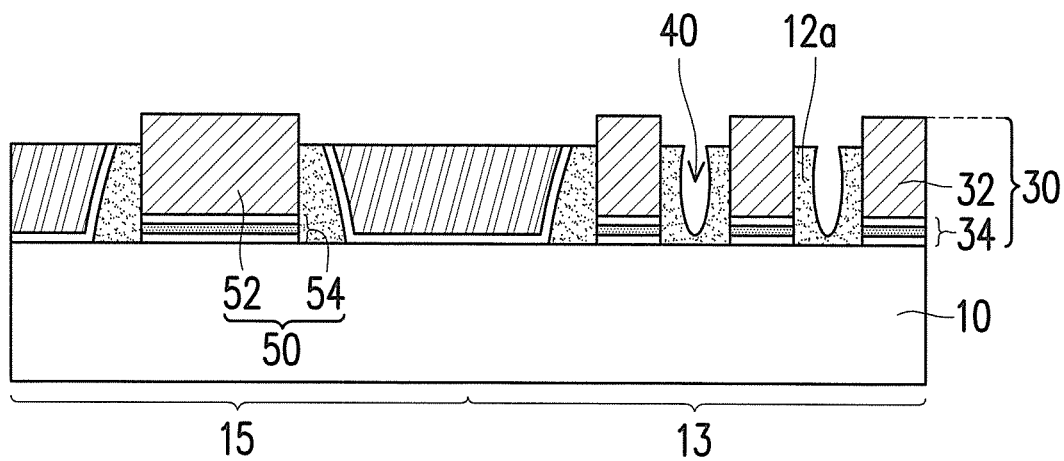

With reference to FIG. 1B and FIG. 1C, a planarization process is performed on the dielectric layer 16 until the stop layer 14 is exposed. The planarization process is chemical mechanical polishing, for example. With reference to FIG. 1C and FIG. 1D, then, the stop layer 14, and the hard mask layers 36 and 56 are removed to expose the gate conductor layers 32 and 52. A removing method thereof includes wet etching or Siconi etching, for example; however, the invention is not limited thereto. With reference to FIG. 1D and FIG. 1E, next, a dielectric layer 12a is formed by performing an etch-back process on the dielectric material layer 12 between two adjacent gate structures 30 and 50. An upper surface of the dielectric layer 12a is lower than upper surfaces of the gate conductor layers 32 and 52, and the dielectric layer 12a between two adjacent gate structures 30 in the first region 13 has a first groove 40.

Figure 1F:
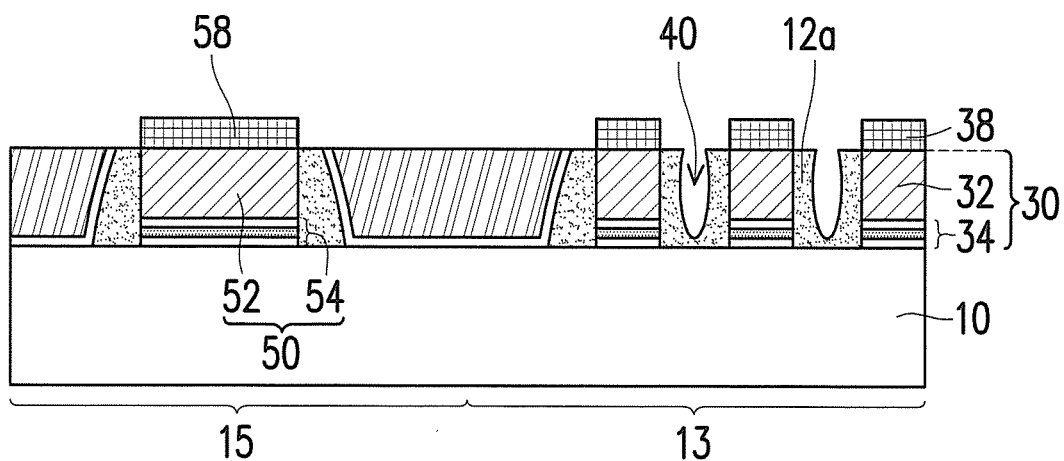

With reference to FIG. 1F, thereafter, metal silicide layers 38 and 58 are formed on the gate conductor layers 32 and 52 of the gate structures 30 and 50 by performing a metal silicification process. A material of the metal silicide layers 38 and 58 is a silicide of titanium, tungsten, cobalt, nickel, copper, molybdenum, tantalum, erbium, zirconium, or platinum, for example. In an embodiment, the material of the metal silicide layers 38 and 58 is cobalt silicide (CoSi), for example. Here, the metal silicification process includes depositing a layer of cobalt, performing a first rapid thermal process (RTP), performing cobalt silicide selective etching, removing unreacted cobalt, and then performing a second rapid thermal process (RTP) to cause reaction of cobalt and silicon in the gate conductor layers 32 and 52, for example, so as to obtain the metal silicide layers 38 and 58 composed of cobalt silicide.

Figure 1G:
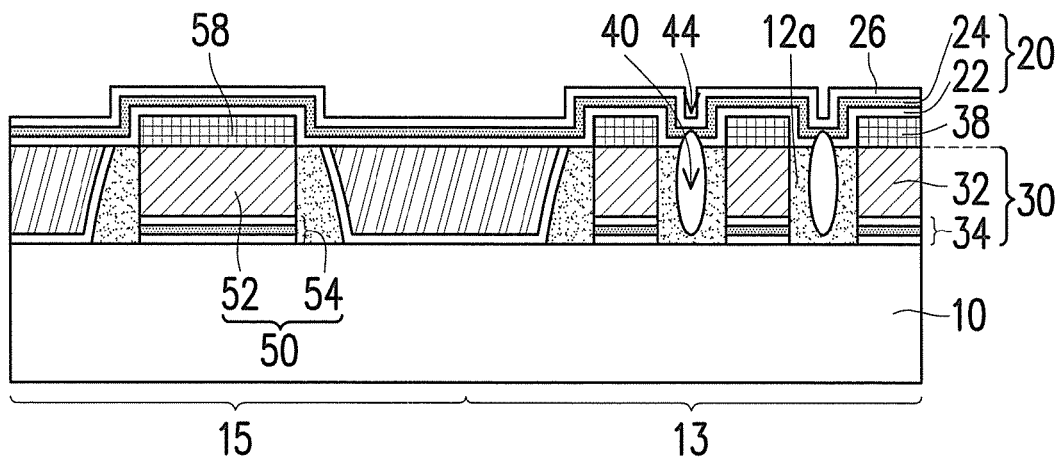

With reference to FIG. 1G, an intermediate layer 20 is formed. The intermediate layer 20 covers the dielectric layer 12a, the first groove 40, and the metal silicide layers 38 and 58 on the gate structures 30 and 50. The intermediate layer 20 on each first groove 40 has a second groove 44. Afterwards, a material layer 26 is formed to cover the intermediate layer 20. In an embodiment, the intermediate layer 20 is a stack structure that includes a first intermediate material layer 22 and a second intermediate material layer 24. A method of forming the intermediate layer 20 and the material layer 26 includes forming the first intermediate material layer 22 on the metal silicide layers 38 and 58 of the gate structures 30 and 50 and the dielectric layer 12a, then forming the second intermediate material layer 24 on the first intermediate material layer 22, and thereafter forming the material layer 26. A material of the first intermediate material layer 22 is different from a material of the second intermediate material layer 24. The material of the first intermediate material layer 22 is silicon oxide, phosphosilicate glass, borophosphosilicate glass, or a combination thereof, for example. A forming method thereof includes chemical vapor deposition, for example. The material of the second intermediate material layer 24 is silicon nitride, silicon oxynitride, silicon carbon oxynitride, or silicon carbide, for example. A forming method thereof includes chemical vapor deposition or atomic layer deposition (ALD), for example. In an exemplary embodiment, the material of the first intermediate material layer 22 is silicon oxide and the material of the second intermediate material layer 24 is silicon nitride, for example, and the material layer 26 and the first intermediate material layer 22 are formed of the same material, e.g. silicon oxide. However, it is noted that the invention is not limited thereto.

Figure 1H:
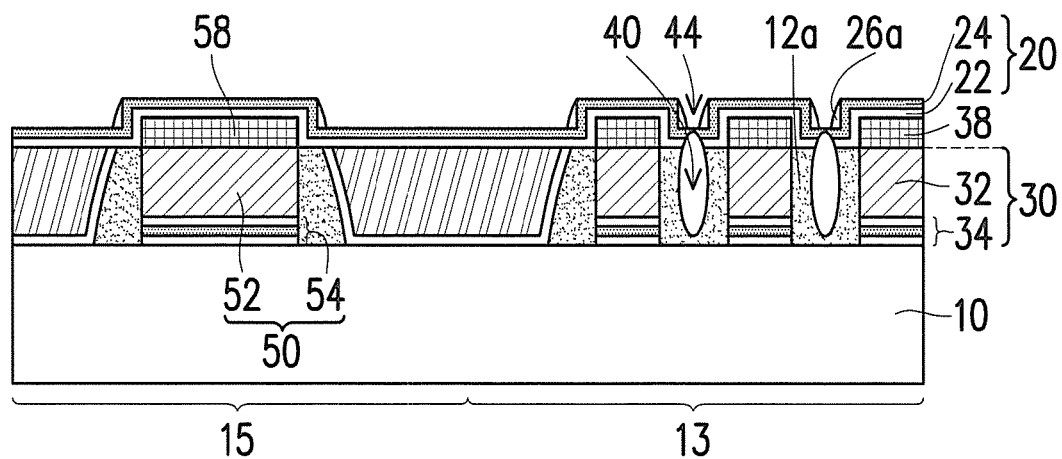
Figure 1I:
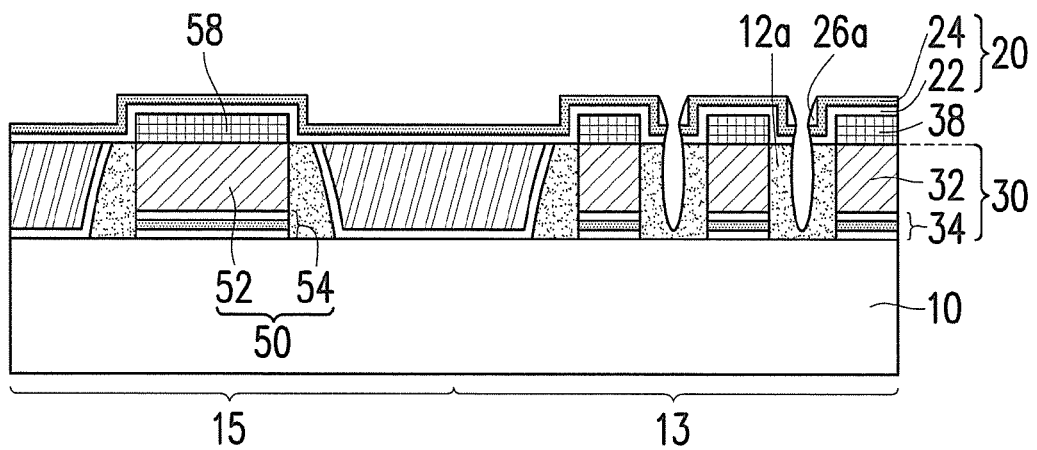
Figure 1J:
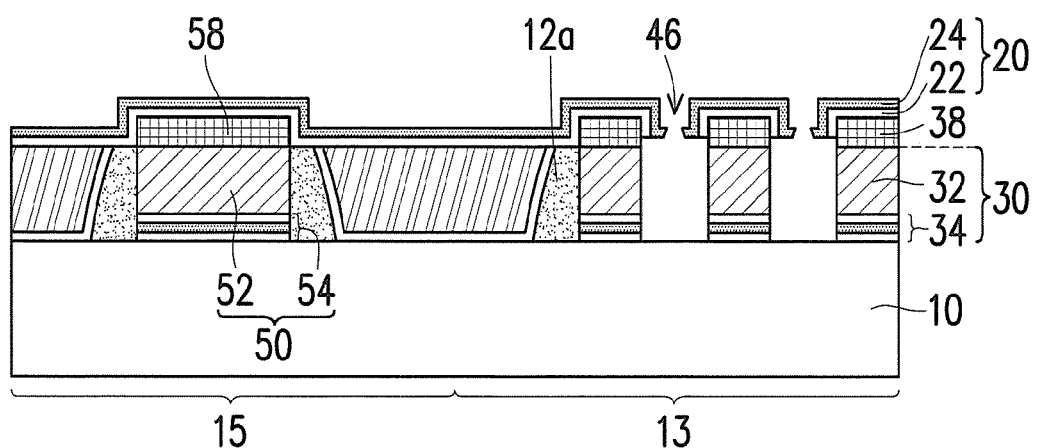

With reference to FIGS. 1G and 1H, an anisotropic etching process is performed on the material layer 26, so that a spacer 26a is formed on a sidewall of each second groove 44 and the intermediate layer 20 is exposed. Then, with reference to FIG. 1H and FIG. 1I, the intermediate layer 20 (the second intermediate material layer 24) that covers the first groove 40 is very thin. Therefore, the exposed intermediate layer 20 can be easily removed with the spacer 26a as a mask, so as to form a plurality of openings 46 in the intermediate layer 20 in the first region 13, wherein each opening 46 is located between two adjacent gate structures 30. With reference to FIG. 1I and FIG. 1J, thereafter, the dielectric layer 12a between two adjacent gate structures 30 in the first region 13 is removed through the opening 46. In another embodiment, as shown in FIG. 1I and FIG. 1J, when the dielectric layer 12a between two adjacent gate structures 30 in the first region 13 is removed through the opening 46, a portion of the first intermediate material layer 22 and the spacer 26a on the dielectric layer 12a in the first region 13 are removed simultaneously. A method of removing the spacer 26a, the dielectric layer 12a between two adjacent gate structures 30, and the portion of the first intermediate material layer 22 on the dielectric layer 12a in the first region 13 includes wet etching or Siconi etching, for example; however, the invention is not limited thereto.

Figure 1K:
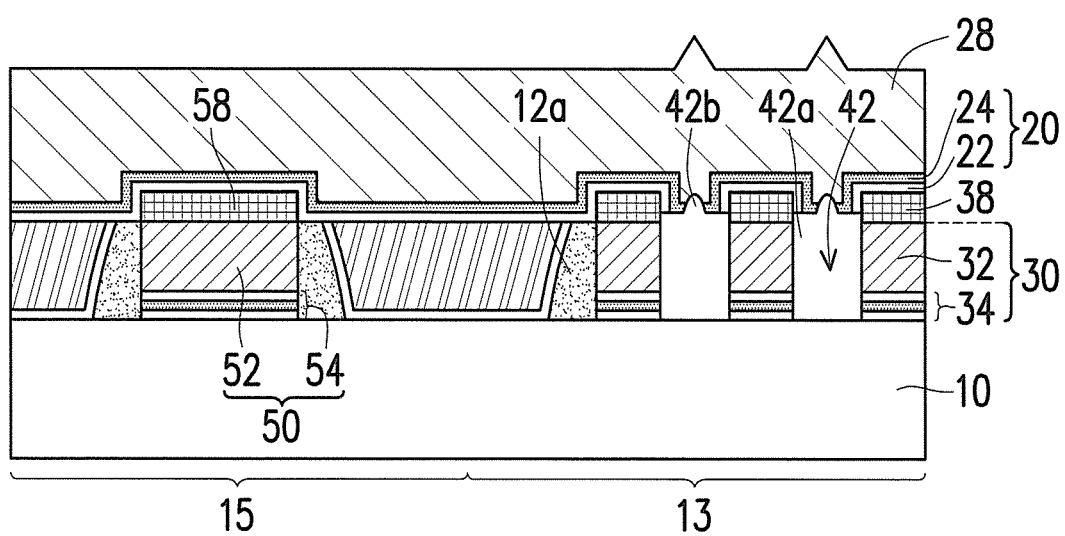

With reference to FIG. 1J and FIG. 1K, a dielectric layer 28 is formed on the intermediate layer 20, so as to define an air gap 42 between two adjacent gate structures 30 in the first region 13. A material of the dielectric layer 28 is silicon oxide, phosphosilicate glass, borophosphosilicate glass, or a combination thereof, for example. A method of forming the dielectric layer 28 includes HDP-CVD, for example.

With reference to FIG. 1K, the structure of the semiconductor device according to the embodiment of the invention includes the substrate 10, the gate structures 30 and 50, the intermediate layer 20, the dielectric layer 28, and the air gap 42. The gate structures 30 and 50 are disposed on the substrate 10, and each of the gate structures 30 and 50 at least include the gate conductor layers 32 and 52 and the metal silicide layers 38 and 58 respectively. The intermediate layer 20 is located on the gate structures 30 and 50 and above the substrate 10 between two adjacent gate structures 30 and 50. The dielectric layer 28 is disposed on the intermediate layer 20.

Further, with reference to FIG. 1K, in an embodiment of the invention, the intermediate layer 20 is a stack structure that includes the first intermediate material layer 22 and the second intermediate material layer 24. The first intermediate material layer 22 is disposed on the surfaces and a portion of the sidewalls of the gate structures 30 and 50. The second intermediate material layer 24 is disposed on the first intermediate material layer 22. The material of the first intermediate material layer 22 is different from the material of the second intermediate material layer 24. Furthermore, with reference to FIG. 1K, the air gap 42 is formed between two adjacent gate structures 30, wherein a volume of each air gap 42 is 5% to 95% of the gap between the two adjacent gate structures 30, for example. According to an embodiment of the invention, the air gap 42 includes a main space 42a and a protruding space 42b, for example. The main space 42a is defined by the sidewalls of two adjacent gate structures 30 and the metal silicide layers 38, the surface of the substrate 10, and the intermediate layer 20. A height of the main space 42a is greater than the height of the surface of the gate conductor layer 32. The protruding space 42b is above the main space 42a and defined by the intermediate layer 20 and the dielectric layer 28. The shape of the main space 42a may be rectangular, trapezoid, or a combination thereof, for example; and the shape of the protruding space 42b may be triangular, arched, or a combination thereof, for example. However, the invention is not limited thereto. In an embodiment, the shape of the main space 42a is rectangular, and the shape of the protruding space 42b is arched, for example. Because the height of the main space 42a of the air gap 42 is greater than the height of the surface of the gate conductor layer 32, interference caused by conduction between the gate structures is prevented effectively.

To conclude the above, the manufacturing method of the semiconductor device, provided by the invention, is adapted for forming the air gap between two adjacent gate structures, and the height of the air gap is greater than the height of the gate conductor layer of the gate structure. Therefore, the resistor-capacitor delay (RC delay) between the gate structures is effectively prevented to improve electrical interference between the components in the semiconductor device, thereby enhancing efficiency of the semiconductor device.

It will be apparent to those skilled in the art that various modifications and variations can be made to the structure of the disclosed embodiments without departing from the scope or spirit of the invention. In view of the foregoing, it is intended that the invention covers modifications and variations of this disclosure provided they fall within the scope of the following claims and their equivalents.

What is claimed is:

1. A semiconductor device, comprising:
    a plurality of gate structures disposed on a substrate;
    an intermediate layer disposed on the gate structures and above the substrate between two adjacent gate structures, wherein the intermediate layer comprises:
    a first intermediate material layer disposed on a surface and sidewalls of each of the gate structures; and
    a second intermediate material layer disposed on the first intermediate material layer, wherein a material of the second intermediate material layer comprises silicon nitride, and a material of the first intermediate material layer comprises silicon oxide; and a dielectric layer disposed on the intermediate layer, wherein an air gap is formed between two adjacent gate structures, and the air gap comprises:

a main space defined by the sidewalls of two adjacent gate structures, a surface of the substrate, and the intermediate layer; and a protruding space located on the main space, defined by the intermediate layer and the dielectric layer, and protrudes into the dielectric layer.

2. The semiconductor device according to claim 1, wherein the second intermediate material layer further comprises an opening between two adjacent gate structures.

3. The semiconductor device according to claim 1, wherein each of the gate structures comprises a gate conductor layer and a metal silicide layer, and a height of the main space is greater than a height of a surface of the gate conductor layer.

4. The semiconductor device according to claim 3, wherein the semiconductor device comprises a memory device, and each of the gate structures comprises a charge storage layer disposed between the corresponding gate conductor layer and the substrate.

5. The semiconductor device according to claim 1, wherein a volume of each air gap is 5% to 95% of a gap between two adjacent gate structures.

* * * * *